(12) United States Patent  
Yanagisawa et al.

(10) Patent No.: US 6,649,528 B2
(45) Date of Patent: Nov. 18, 2003

(54) LOCAL DRY ETCHING METHOD

(75) Inventors: Michihiko Yanagisawa, Sagamihara (JP); Tadayoshi Okuya, Yokohama (JP)

(73) Assignee: Speedfam Co., Ltd., Kanagawa (JP)

( * ) Notice: Subject to any disclaimer, the term of this patent is extended or adjusted under 35 U.S.C. 154(b) by 0 days.

(21) Appl. No.: 10/144,800

(22) Filed: May 15, 2002

(65) Prior Publication Data

US 2002/0173149 A1 Nov. 21, 2002

(30) Foreign Application Priority Data

May 18, 2001 (JP) ........................................ 2001-149452

(51) Int. Cl.[7] ............................................. H01L 21/302
(52) U.S. Cl. ........................ 438/706; 438/689; 438/14; 438/5
(58) Field of Search .................. 438/706, 707, 438/712, 714, 5, 9, 8, 14, 16, 17, 689

(56) References Cited

U.S. PATENT DOCUMENTS 6,301,510 B1 * 10/2001 Cooperberg et al. .......... 700/28

FOREIGN PATENT DOCUMENTS

JP 2000-223479 8/2000

* cited by examiner

*Primary Examiner*—Caridad Everhart
(74) *Attorney, Agent, or Firm*—Morrison & Foerster LLP

(57) ABSTRACT

In a local dry etching method of the invention, a surface of a representative wafer sampled from a lot is test etched, each wafer of which is sliced from the same ingot, and initial data of recesses and projections of which is previously known, recesses and projections of the representative wafer is measured after test etched, an etching profile is derived from the initial data and measured data and then respective wafer surfaces of the lot are etched in condition calculated by using at least the derived etching profile.

2 Claims, 6 Drawing Sheets

MASK

FIG. 6B

TEST ETCH

FIG. 6C

MEASURE

MASK      TEST ETCH      MEASURE

LOCAL DRY ETCHING METHOD

BACKGROUND OF THE INVENTION

1. Field of the Invention

The present invention relates to the field of a method of planarizing a semiconductor wafer by a local dry etching method, especially for planarizing in etching condition that nanotopography is prevented from occurring.

2. Description of the Related Art

Figure 1:
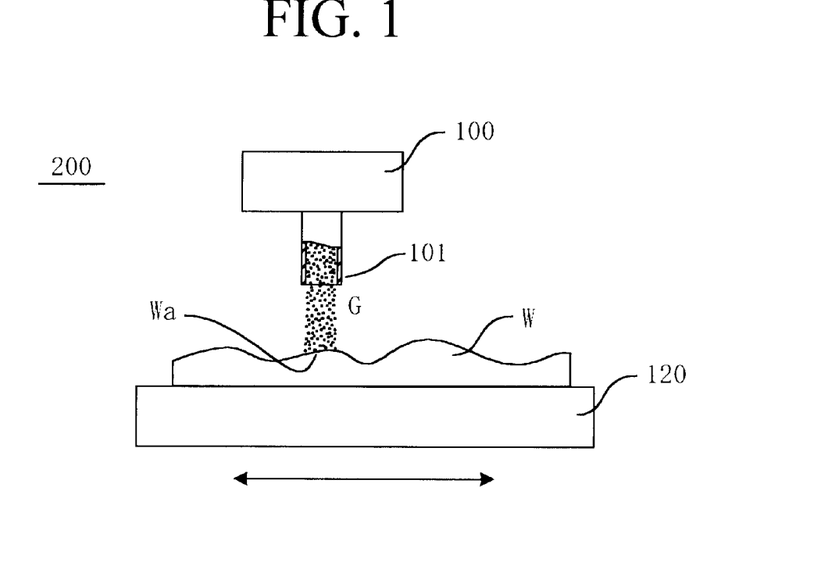
FIG. 1 is a sectional view showing a general example of a local dry etching apparatus.

In recent years, in order to planarize a silicon wafer, there has been used a local dry etching apparatus for locally etching the silicon wafer by activated species generated in plasma as disclosed in Japanese Laid-Open Patent No. 2000-223479. FIG. 1 shows a sectional view of a general example of such a local dry etching apparatus 200.

According to the local dry etching apparatus 200, sulfur hexafluoride ($SF_6$) gas (or other compound gases of F) is subjected to electricity discharge by a plasma generator 100 to thereby produce F activated species and by injecting the F activated species gas G from a nozzle portion 101 to a surface Wa of a silicon wafer W on a chuck 120, etching is carried out locally at a portion of the surface Wa thicker than a reference thickness, or a relatively thick portion.

At this occasion, with regard to the relatively thick portion, moving speed of the chuck 120, that is, relative speed of the nozzle portion 101 is slowed to thereby prolong a time period of injecting the F activated species gas G and conversely, with regard to a thin portion, the relative speed of the nozzle portion 101 is speeded to thereby shorten the time period of injecting the F activated species gas G, thereby a total amount of etching (material removal) is adjusted for respective portions and the entire surface Wa of the silicon wafer W is planarized.

Figure 2:
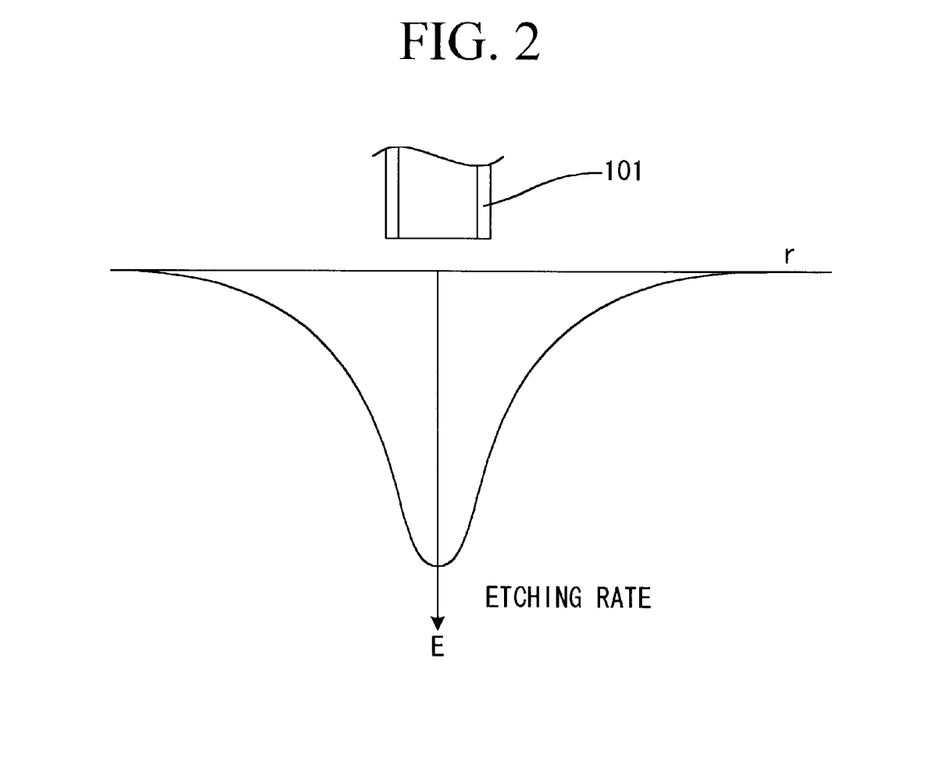
FIG. 2 is a graph showing a general example of a distribution of an etching rate E.

A rate of the material removal by the activated species gas G from the wafer W is referred to as etching rate E and is distributed in accordance with a distance from a central axis thereof as shown in FIG. 2. The distribution curve of the etching rate E is also referred to as etching profile.

Figure 3:
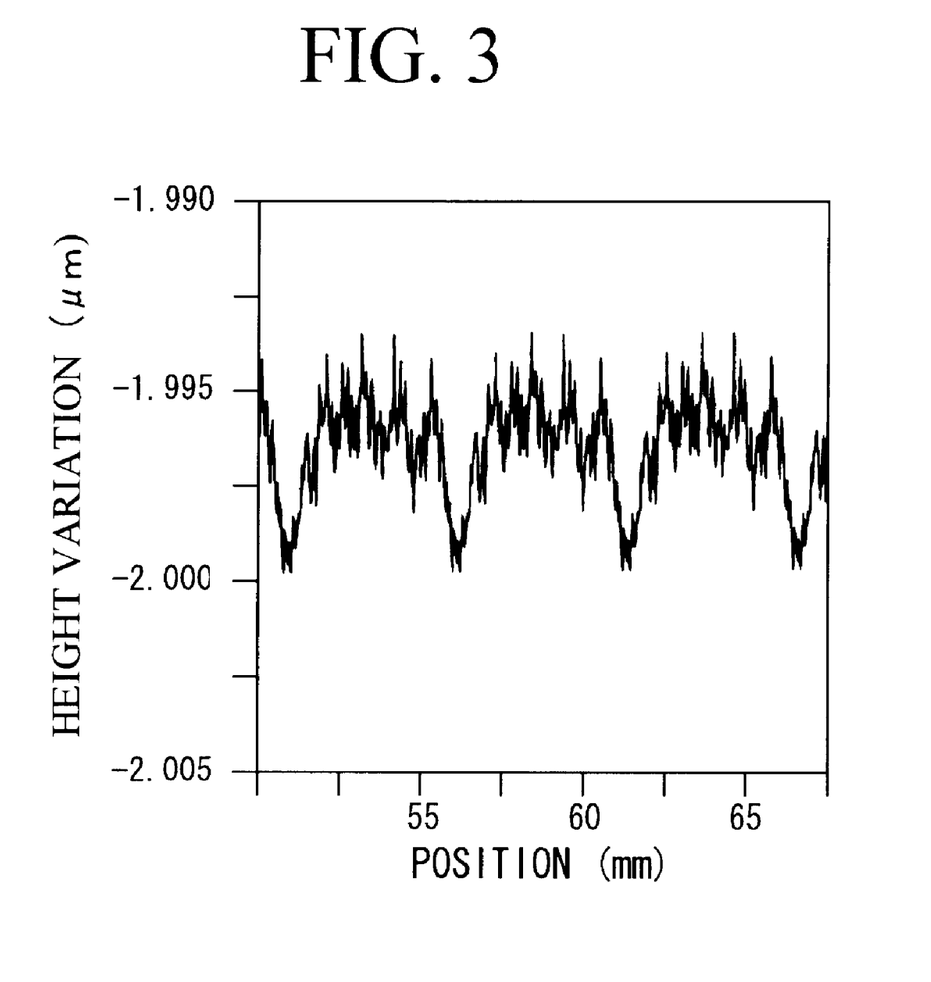
FIG. 3 is an illustrative graph showing a general example of nanotopography.

Nanotopograghy is recesses and projections or surface height variation exists on the surface of a semiconductor wafer. A spatial wavelength of nanotopography falls in a range of 0.2 mm through 20 mm and a difference of height between a wave top and wave bottom (wave height) falls in a range of 1 through several hundreds nm. FIG. 3 shows an illustrative graph of nanotopography.

Multilayered wiring technology has been adopted for a semiconductor device manufacturing and in order to meet request from the wiring technology, there has been developed a chemical/mechanical composite polishing method referred to as CMP (Chemo-Mechanical Polishing). Although a surface of a semiconductor wafer can be planarized in very high accuracy by the CMP technology, there has been posed a new problem of a different and finer level of recesses and projections, that is, nanotopography. Nanotopography cannot be removed even by the CMP technology. As the yield of semiconductor device manufacturing is deteriorated by non-uniformity in thickness of the insulator layer of the wafer and the recesses and projections of the wafer surface cause non-uniformity, nanotopography has become a significant problem. As is a new problem, few technical documents, e.g. U.S. patent application Ser. No. 10/062494, deal in nanotopography.

Nanotopography is said to be caused by irregularity in each processing of semiconductor device manufacturing, e.g. non-uniformity in doping in a step of pulling up silicon crystal, lap mark, polish mark, slicing mark, etching mark etc.

SUMMARY OF THE INVENTION

The object of present invention is to prevent nanotopography from occurring in planarizing process of the wafers using local dry etching technology and further to remove nanotopography produced in the former processes of the wafers.

According to a first aspect of the present invention, there is provided a local dry etching method. The method includes the following steps: test etching a surface of a representative wafer sampled from a lot, wherein each wafer of said lot being sliced from the same ingot and initial data of recesses and projections of said representative wafer being known; measuring recesses and projections of said representative wafer after said test etching is executed; deriving an etching profile from said initial data and measured data in said measuring step; and etching respective wafer surfaces of said lot in condition calculated at least by using said etching profile.

According to a second aspect of the present invention, a local dry etching method according to the first aspect of the invention is provided. The method includes the following steps: calculating a scanning speed for planarizing said wafer based on an assumed pitch width and said etching profile and predicted nanotopography: and repeating the step of calculating a scanning speed by changing said assumed pitch width to a different value until nanotopography falls in an allowable range.

According to a third aspect of the invention, a local dry etching method according to the first aspect of the invention is provided, wherein: the step of test etching is executed by previously determined scanning speed along a test line on said representative wafer; and the step of measuring recesses and projections provides data of recesses and projections along a cross line in a direction perpendicular to said test line.

According to a fourth aspect of the invention, a local dry etching method according to the third aspect of the invention is provided. The method further includes the following steps: forming masking lines spaced apart from each other by a sufficient interval before the step of test etching a surface of a representative wafer; and removing said masking lines after the step of test etching a surface of a representative wafer; wherein measurement is executed by including regions protected by said masking lines in the step of measuring recesses and projections.

According to a fifth aspect of the invention, a local dry etching method according to the first aspect of the invention is provided, wherein: the step of test etching is executed by injecting an activated species gas from a nozzle stationary at one point on said representative wafer for a predetermined period of time; and the step of measuring recesses and projections provides data of recesses and projections on a line at least passing through said point.

According to a sixth aspect of the invention, a local dry etching method according to the fifth aspect of the invention is provided. The method further includes the following steps: forming a masking circle in a ring-like shape before the step of test etching a surface of a representative wafer; and removing said masking circle after the step of test etching a surface of a representative wafer; wherein measurement is executed by including region protected by said masking circle in the step of measuring recesses and projections.

According to a seventh aspect of the invention, a local dry etching method according to the first aspect of the invention is provided, wherein a stylus type surface roughness measuring apparatus is used in the step of measuring.

According to an eighth aspect of the invention, a local dry etching method according to the first aspect of the invention is provided, wherein an optical type surface roughness measuring apparatus is used in the step of measuring.

In present invention, there is prepared a representative wafer sampled or chosen from a wafer lot, the lot being a bunch of wafers sliced from the same silicon crystal ingot and initial surface height variation (recesses and projections) of the representative wafer is known previously. Prior to palanarizing the wafers of the entire lot, test etching is executed on the representative wafer in predetermined etching conditions, e.g. kinds of the activated species gas and added gasses, flow rate, power of microwave, etc. The surface height variation of the wafer is measured and an etching profile is derived from the measured data and the initial data. Thereby, there is achieved an effect of capable of reducing occurrence of failed products by nanotopography. Further, there is used the maximum pitch width p so far as nanotopography does not occur for each lot and therefore, there is achieved an effect of capable of meeting conflicting requests of nanotopography and calculation load.

Other objects and advantages besides those discussed above shall be apparent to those skilled in the art from the description of preferred embodiments of the invention which follow. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and together with the description, serve to explain the principles of the invention.

DETAILED DESCRIPTION OF PREFERRED EMBODIMENTS

Now, preferred embodiments of the present invention will be described in detail while referring to the accompanying drawings.

Embodiment 1

Figure 4:
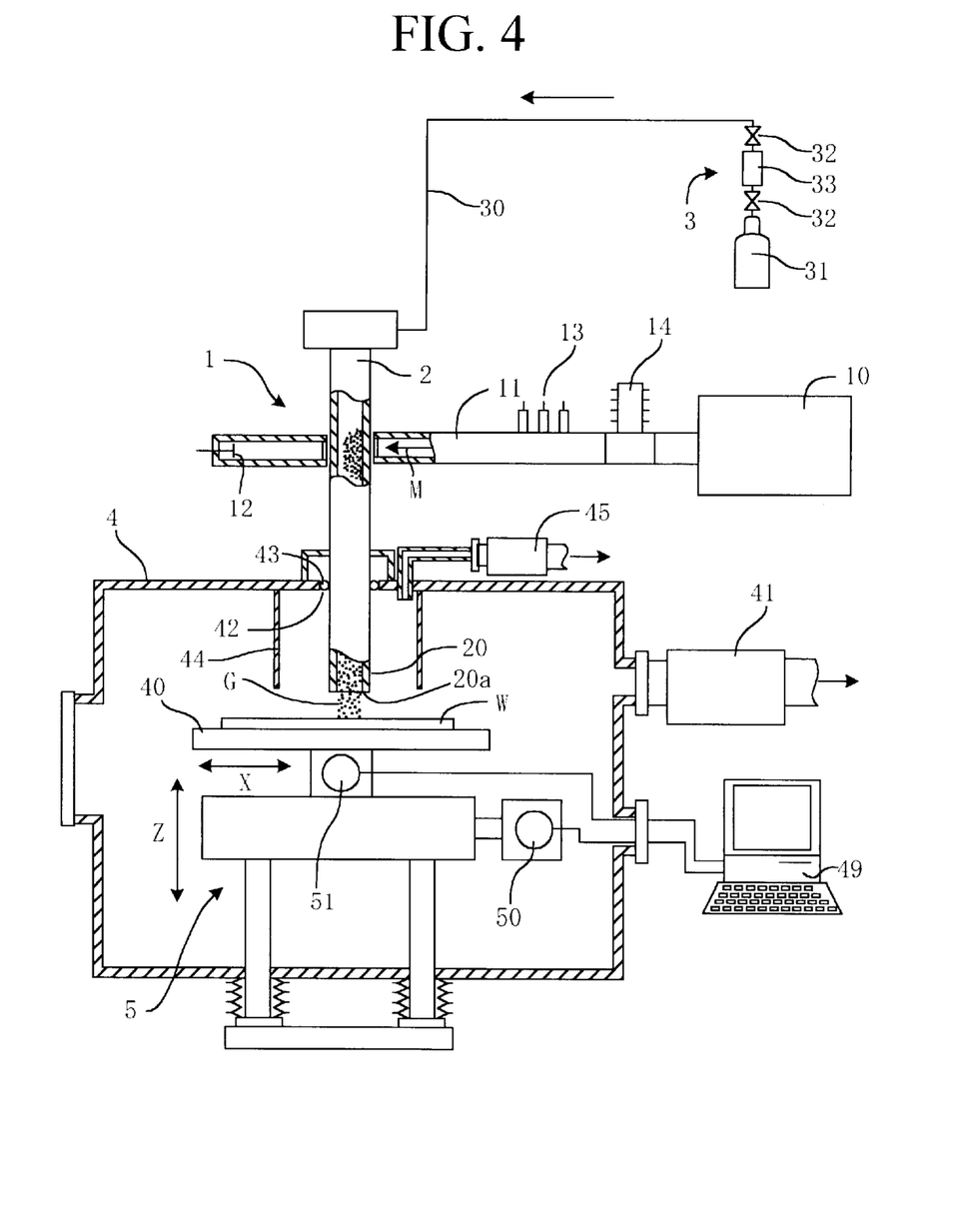
FIG. 4 is an explanatory view for explaining an outline of a local dry etching apparatus used in the invention.

The local dry etching apparatus is provided with a plasma generator 1, a gas supply apparatus 3 and an X-Y drive mechanism 5. The plasma generator 1 is an apparatus for producing activated species gas G including neutral radicals by forming a gas in an alumina discharge tube into a plasma and comprises a microwave oscillator 10 and a waveguide 11. The microwave oscillator 10 is a magnetron and can oscillate microwave M of predetermined frequency.

The waveguide 11 is for propagating the microwave M oscillated from the microwave oscillator 10 and the alumina discharge tube 2 is inserted in the waveguide 11.

At an inner portion at a left side end of the waveguide 11, there is attached a reflecting plate (short plunger) 12 for forming a standing wave by reflecting the microwave M. Further, at a middle of the waveguide 11, there are attached a stub tuner 13 for aligning a phase of the microwave M and an isolator 14 for bending the reflected microwave M directed to the microwave oscillator 10 in a direction of 90 degrees.

The alumina discharge tube 2 is a cylindrical body having a nozzle portion 20 at a lower end portion thereof and an upper end portion thereof is connected with a supply pipe 30 of the gas supply apparatus 3.

The gas supply apparatus 3 is an apparatus for supplying a gas into the alumina discharge tube 2 and is provided with a cylinder 31 of $SF_6$ (sulfur hexafluoride) gas and is connected to the supply pipe 30 via valves 32 and a flow rate controller 33. Further, although single gas can be constituted by the sulfur hexafluoride gas in this way, a mixture gas including the sulfur hexafluoride gas can also be constituted by simultaneously supplying other gas to the supply pipe 30.

By adopting such a constitution in the plasma generator, the gas is supplied from the gas supply apparatus 3 to the alumina discharge tube 2 and further, when the microwave M is oscillated from the microwave oscillator 10, the gas is formed into a plasma at inside of the alumina discharge tube 2 and the activated species gas G produced by plasma formation is injected from the nozzle portion 20.

When a silicon wafer W is arranged on a wafer table 40 at inside of a chamber 4, the silicon wafer W is adsorbed to the wafer table 40 by electrostatic force thereof. The chamber 4 is attached with a vacuum pump 41 and inside of the chamber 4 can be vacuumed by the vacuum pump 41. Further, a hole 42 is perforated at a central portion of the ceiling board of the chamber 4 and the nozzle portion 20 of the alumina discharge tube 2 is inserted into the chamber 4 via the hole 42. Further, an O-ring 43 is mounted between the hole 42 and the alumina discharge tube 2 to there by maintain the gap between the hole 42 and the aluminal discharge tube 2 in airtight. Further, surrounding the nozzle portion 20, a duct 44 is provided and gasses produced by reaction in etching is exhausted to outside of the chamber 4 by the vacuum pump 45.

The X-Y drive mechanism 5 is arranged at inside of the chamber 4 and supports the wafer table 40. The X drive motor 50 and Y drive motor of the mechanism 5 feed the wafer table 40 in X and Y directions. The wafer W is moved in arbitrary directions and to arbitrary positions relative the nozzle portion 20 by integrating the motion of the motors 50, 51.

When the valves 32 of the gas supply apparatus 3 are opened, the $SF_6$ gas in the cylinder 31 flows into the supply pipe 30 and is conducted to the alumina discharge tube 2. The valve 32A adjusts flow rate of the $SF_6$ gas.

In parallel with operation of supplying the $SF_6$ gas or a mixture gas, the microwave oscillator 10 is driven. Then, the $SF_6$ gas is formed into plasma state by the microwave M and there is produced activated species gas G including neural F (fluorine) radicals. Thereby, the activated species gas G is guided to the nozzle portion 20 of the alumina discharge tube 2 and is injected from the opening 20a to the surface of the silicon wafer W.

Figure 5:
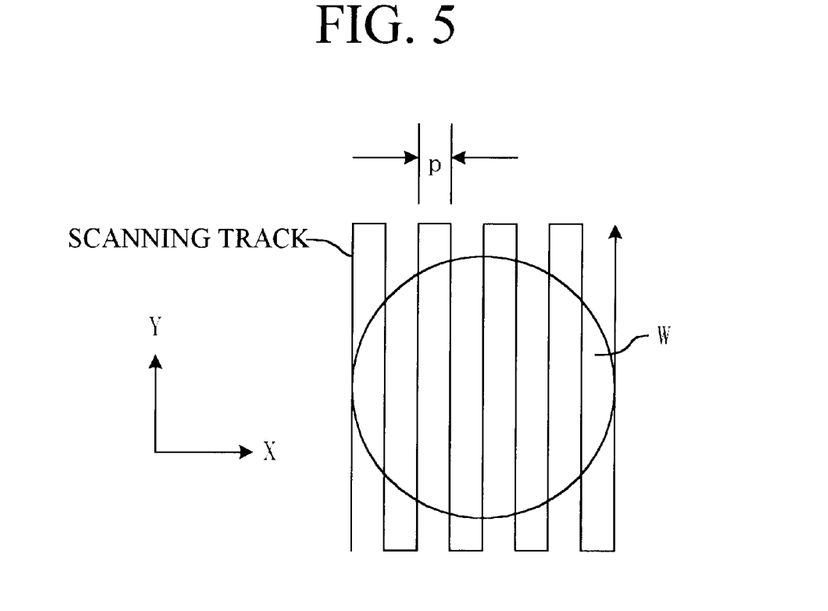
FIG. 5 is an explanatory view showing a scanning track of a nozzle portion, that is, a track covering entire surface of a wafer W by a pitch width p.

In parallel with injection of the activated species gas, the X-Y drive mechanism 5 is driven by a control computer 49 to thereby move the wafer table 40 adsorbed with the silicon wafer W in the X-Y directions. By the movement in the X-Y directions, the wafer W is scanned by the nozzle portion 20. FIG. 5 shows a scanning track of the nozzle portion 20, which is a track covering the entire surface of the wafer W by a pitch width p.

The material of the surface of the silicon wafer W chemically reacts with the activated species gas, and gaseous products flow away from there along with the injected gas. Thereby, the material is removed from the surface of the silicon wafer W. As an amount of material removal is substantially proportional to a time period the surface being exposed to the gas, the material removal rate, namely the etching rate, is dependent on relative speed between the silicon wafer W and the nozzle portion 20.

The etching rate or etching profile is not merely dependent on the relative speed but also dependent on the other factors, e.g. kind of gas, flow rate of the gas, power of microwave M, particular inherence of wafer lot sliced from the same ingot etc. Exceptionally, the particular inherence of the wafer lot is impossible to control. In the prior art, the particular inherence is not recognized and hence dry etching of wafer is accomplished without regard to difference of the particular inherences or difference of etching profiles respectively come from the particular inherences.

According to the invention, prior to etching wafers in the same lot, the etching characteristic with regard to the lot is obtained by test etching of the representative wafer of the lot. It is possible to select or sample a single wafer or few wafers from the wafers sliced from the same ingot as representative. When three are sampled, it is preferable to disperse sampling portions, as one from center and two from vicinities of both ends of the ingot.

FIGS. 6A, 6B and 6C and FIG. 7 are explanatory views and a flowchart for explaining processings with regard to Embodiment 1 of the invention.

Figure 7:
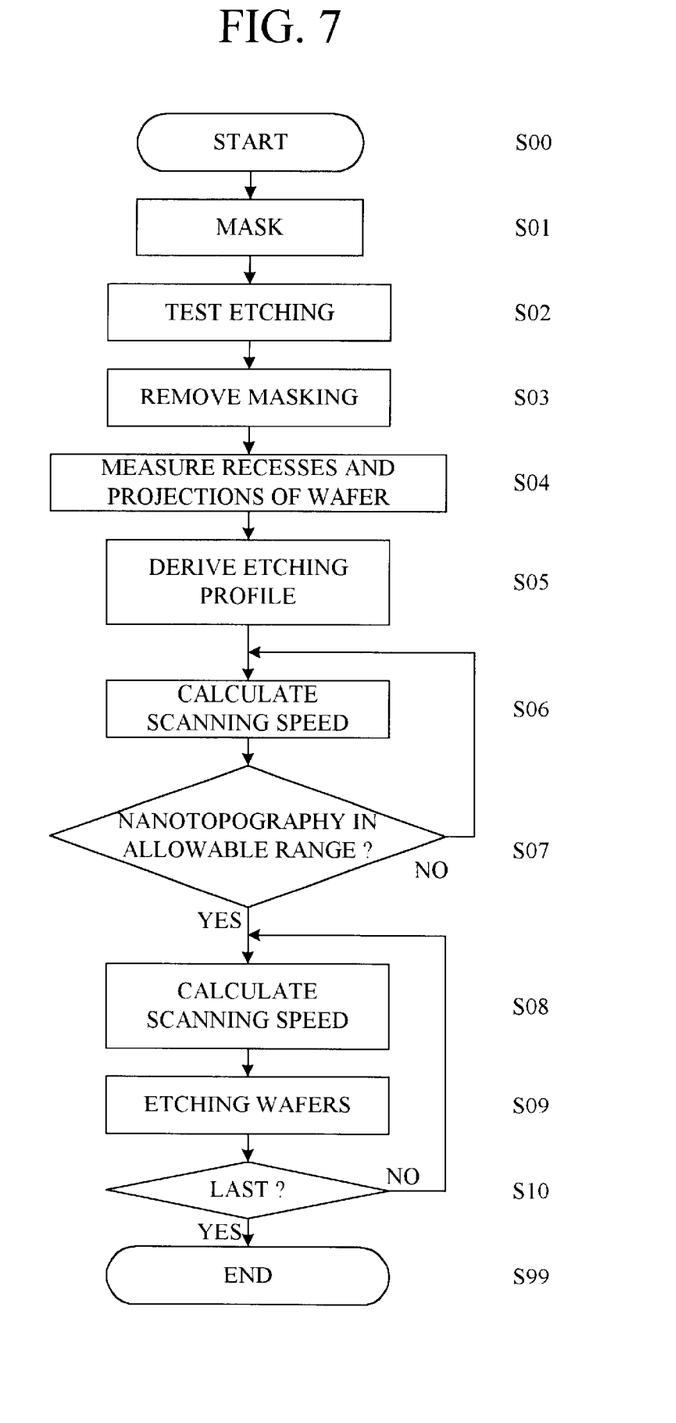
FIG. 7 is a flowchart of the embodiments 1, 2 and a part of the embodiment 3 for explaining the invention.

In the step S01 of FIG. 7, two masking lines (FIG. 6A) at a pertinent interval larger than an etching diameter anticipated are formed on the representative wafer, initial data of recesses and projections being obtained previously. The masking lines formed by coating, for example, a resist r and protect regions for reference of measurement from being etched in the next test etching.

In the step S02, test etching is carried out along a test line Le (FIG. 6B) in predetermined conditions.

Figure 6A:
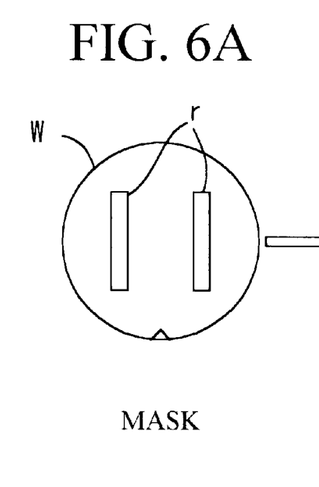
FIGS. 6A, 6B and 6C are explanatory views for explaining a procedure of measuring etching characteristic of a wafer W in the embodiment 1.
Figure 6B:
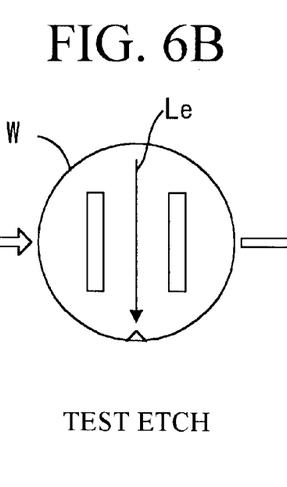
Figure 6C:
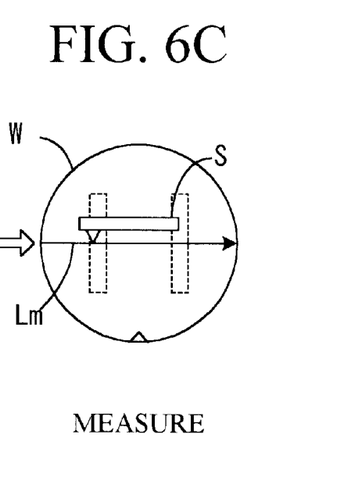

In the step S03, the masking lines are removed from the wafer W.

In the step S04, recesses and projections are measured along the cross line Lm of the wafer W (FIG. 6C) including the region for reference by using a stylus type surface measuring apparatus S. The cross line Lm is perpendicular to the Le.

In the step S05, an etching profile is derived from the initial data and the measured data of recesses and projections of the test etched wafer. As the measured data includes the same data with regard to the reference region, an amount of material removal at each point, namely etching profile, is derived by calculation. When a plurality of wafers is sampled, the etching profile is obtained by averaging respectively calculated etching profiles.

In the step S06, a scanning speed is calculated for planarizing the wafers based on an assumed pitch width p and etching profile derived in the above step and nanotopography is predicted.

In the step S07, if nanotopography does not fall in an allowable range (in case of 'NO'), the above-assumed pitch width p is changed to a different value (for example, smaller value) and the step S06 repeated until nanotopography falls in the allowable range (until 'YES'). In the step S06, calculation based on the newly assumed pitch width p is executed.

In the step S08, the scanning speeds for the respective wafers in the same lot are calculated by using the final value of the assumed scanning pitch p and etching respective wafers are accomplished to the last (S10).

Embodiment 2

Figure 8A:
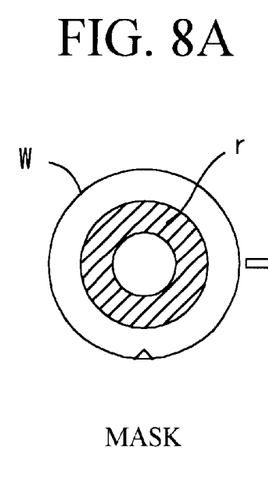
FIGS. 8A, 8B and 8C are explanatory views for explaining a procedure of measuring etching characteristic of a wafer W in the embodiment 2.
Figure 8B:
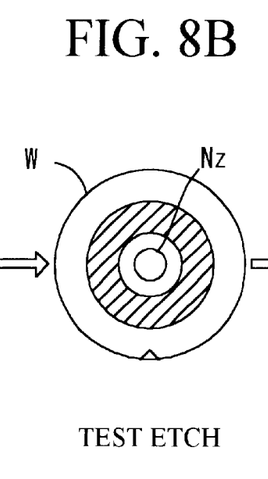
Figure 8C:
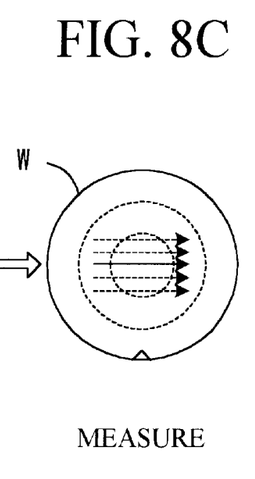

Another example of a shape of a reference region for illustrating an embodiment 2 is shown in FIGS. 8A, 8B and 8C.

In a test etching of this embodiment, the nozzle is stationary to the representative wafer over masking circle of the wafer. The masking circle provides a region for reference.

In the step S01 of FIG. 7, a masking circle in a ring-like shape at the representative wafer W (FIG. 8A) is formed. The masking circle is provided by, for example, coating the resist r. Initial data of recesses and projections of the representative wafer W is obtained previously.

In the step S02, a center of an etching nozzle Nz is aligned to the center of the masking circle and test etching is carried out for a predetermined period time and in predetermined conditions.

In the step S03, the masking circle is removed from the region for reference of the wafer W.

In the step S04, recesses and projections of the wafer Ware measured along several measuring lines (FIG. 8C) including the region for reference by using a stylus type surface measuring apparatus. It is preferable that one of the measuring lines passes through a center of the reference region.

In the step S05, an etching profile is derived from the initial data and the measured data of recesses and projections of the test etched wafer.

Step S06 and thereafter are similar to steps S06–S99 of Embodiment 1. Therefore, an explanation thereof will be omitted.

Embodiment 3

As seen in embodiment 1 and embodiment 2, the reference regions for measurement are taken on the front side of the representative wafer. According to Embodiment 3, the reference region for measurement is taken on the rear side of the representative wafer W, and thereby protection of a reference region is dispensed with. The step S01 for masking and the step S04 for removing masking in FIG. 7 are not necessary in the embodiment 3. The procedure is shown below.

In the step S02, the representative wafer is test etched in the same manner in Embodiment 1 or in Embodiment 2. The initial data of recesses and projections of the wafer concerning thickness are previously provided with.

In the step S04, recesses and projections or thickness of the wafer W is measured.

In the step S05, an etching profile is derived from the initial data and the measured data of recesses and projections of the test etched wafer.

Step S06 and there after are similar to steps S06–S99 of Embodiment 1. Therefore, an explanation thereof will be omitted.

According to Embodiment 3, there is achieved an advantage of dispensing with time and labor of forming the masking or removing the masking.

The surface roughness measuring apparatus is not limited to that of stylus type as shown in embodiments 1 to 3 and hence other types of the measuring apparatus, for example, an optical type utilizing interference or reflection of light, can be used in the invention. As far as reference region is protected from merely being etched in test etching, any other etching resistant members, e.g. an adhesive polyimide tape, are utilized in place of resist r.

As shown by the above-described embodiments, according to the invention, in a certain wafer lot, with regard to a wafer in which data of recesses and projections thereof is known beforehand, the test etching is carried out. The etching profile under the condition is calculated from data of recesses and projections measured after the test etching and the data of recesses and projections known beforehand. The amount of nanotopography produced after planarizing is calculated by using data of the etching profile. It is checked whether the pitch width is proper at this occasion and the pitch width of etching is calculated until the pitch width becomes proper.

It is desirable in a viewpoint of etching accuracy the pitch width p to narrow. However, as the scanning speed to achieve planarization is calculated for each wafer and calculation load to solve hyper complex simultaneous linear equations is remarkably increased when the pitch width p is narrowed. According to the invention, for the each wafer lot, there is given a maximum pitch width p so far as nanotopography does not occur and therefore, conflicting requests of occurrence of nanotopography and calculation load can be met.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A local dry etching method, comprising:

test etching a surface of a representative wafer sampled from a lot, each wafer of said lot being sliced from a same ingot;

measuring recesses and projections of said surface of the representative wafer after said test etching, initial data of recesses and projections of said surface of the representative wafer that is not subjected to the test etching being known;

deriving an etching profile from said initial data and measured data; and etching surfaces of the wafers of said lot in a condition calculated by using at least said etching profile, wherein the test etching comprises injecting a gas of an activated species from a nozzle stationary above one point of said surface of the representative wafer for a predetermined period of time; and the measuring recesses and projections provides data of recesses and projections along a line passing through at least said one point.

2. The local dry etching method of claim 1, further comprising:

forming a masking circle on said surface of the representative wafer before the test etching; and removing said masking circle after the test etching, wherein the measuring includes measuring recesses and projections at a region protected by said masking circle during the test etching.

* * * * *